United States Patent [19]
Chung

[11] Patent Number: 5,260,706
[45] Date of Patent: Nov. 9, 1993

[54] PRIORITY ENCODER

[75] Inventor: Ho-sun Chung, Taegu, Rep. of Korea

[73] Assignee: Samsung Electronics Co., Ltd., Kyunggi, Rep. of Korea

[21] Appl. No.: 864,190

[22] Filed: Apr. 3, 1992

Related U.S. Application Data

[63] Continuation of Ser. No. 567,377, Aug. 15, 1990, abandoned.

[30] Foreign Application Priority Data

Mar. 29, 1990 [KR] Rep. of Korea .................. 90-4224

[51] Int. Cl.⁵ .............................................. H03M 1/36
[52] U.S. Cl. ..................................... 341/160; 341/159
[58] Field of Search ................ 341/160, 159, 158, 136, 341/155; 340/825.51

[56] References Cited

U.S. PATENT DOCUMENTS

| | | | |
|---|---|---|---|
| 4,211,999 | 7/1980 | Clark et al. | 341/160 |
| 4,216,465 | 8/1980 | Huelsman et al. | 341/160 |
| 4,348,741 | 9/1982 | McAlister et al. | 364/900 |
| 4,887,084 | 12/1989 | Yamaguchi | 341/160 |
| 4,958,157 | 9/1990 | Miki et al. | 341/159 X |
| 4,972,378 | 11/1990 | Kitagawa et al. | 365/210 |

Primary Examiner—A. D. Pellinen
Assistant Examiner—Brian K. Young
Attorney, Agent, or Firm—Cushman, Darby & Cushman

[57] ABSTRACT

A priority encoder using a MOS array and neural network concepts is composed of an input side neuron group, an output side neuron group, a synapse group, a bias group and inverters. The encoder is simple in its construction and fast in its operating speed compared with the conventional priority encoders utilizing simple Boolean logic.

8 Claims, 2 Drawing Sheets

PRIORITY ENCODER

This is a continuation of application No. 07/567,377, filed on Aug. 15, 1990, which was abandoned upon the filing hereof.

FIELD OF THE INVENTION

The present invention relates to a priority encoder, and more particularly to the priority encoder utilizing a neural network concept.

The data which computers can process is digital, while the data used by humans has mostly analog values. Therefore, if the data used by humans is to be processed by computers, the data should be converted to digital values.

A number of different Analog to Digital Converters (hereinafter called ADC) for converting analog values to digital values have been developed. The converting methods of the ADC can be classified into two types, i.e., an integration type and a comparison type. The comparison type has a very fast conversion speed compared with the integration type, and is applicable to fields such as image signal processing in which high conversion speeds are required.

FIG. 1 is a block diagram of the 4-bit full-parallel ADC which utilizes a comparator circuit and comprises a comparator circuit 10, and a priority encoder circuit 20.

The above comparator 10 has 15 threshold voltage values Vth1 ~ Vth15 and generates the E1 to E15 inputs to the priority encoder circuit which is necessary for 4-bit A/D conversion. That is, when an analog input VA is applied, the outputs of all of comparators having the threshold values less than the analog input VA have logic state "1".

The design of conventional encoding circuits, utilize simple Boolean logic. However, this requires an increase in inputs and an increase in logic as the resolution of the ADC is increased.

Accordingly, the conventional priority encoder has the problems that the chip area is enlarged with increasing resolution and number of bits and greater power consumption and a reduction of the processing speed results.

SUMMARY OF THE INVENTION

An object of the present invention is to provide a priority encoder having faster operating speed and using a small number of elements.

To achieve the above objectives, a priority encoder is provided that outputs an M bit digital signal by priority encoding the outputs of $2^M$ comparators which compare in full-parallel state by simultaneously inputting an analog signal. The priority encoder according to the present invention includes an input side neuron group connected to the outputs of the comparators. Also included is an output side neuron group corresponding to each bit of the digital signal.

A synapse group is connected between the input side neuron group and the output side neuron group in order to output the digital signal corresponding to the number of "1's" among the output values of the comparators. The priority encoder also includes a bias group for coupling the first power supply voltage with the input line of each output side neuron. Inverters are provided for inverting the outputs of the output side neuron group.

Here, each of the input and output side neuron groups consists of two CMOS inverters, and each CMOS inverter is composed of a PMOS transistor and an NMOS transistor. The synapse group consists of PMOS transistors and NMOS transistors, and the bias group consists of PMOS transistors.

According to the present invention as described above, the priority encoder circuit is made up of a MOS array utilizing the neural network concept, so that it is simple in its construction and fast in its operating speed compared with conventional priority encoders utilizing simple Boolean logic.

These and other objects and advantages will become more apparent from the detailed description along with the accompanying drawings.

DESCRIPTION OF THE PREFERRED EMBODIMENT

Figures 2A, 2B, 2C, 2D:
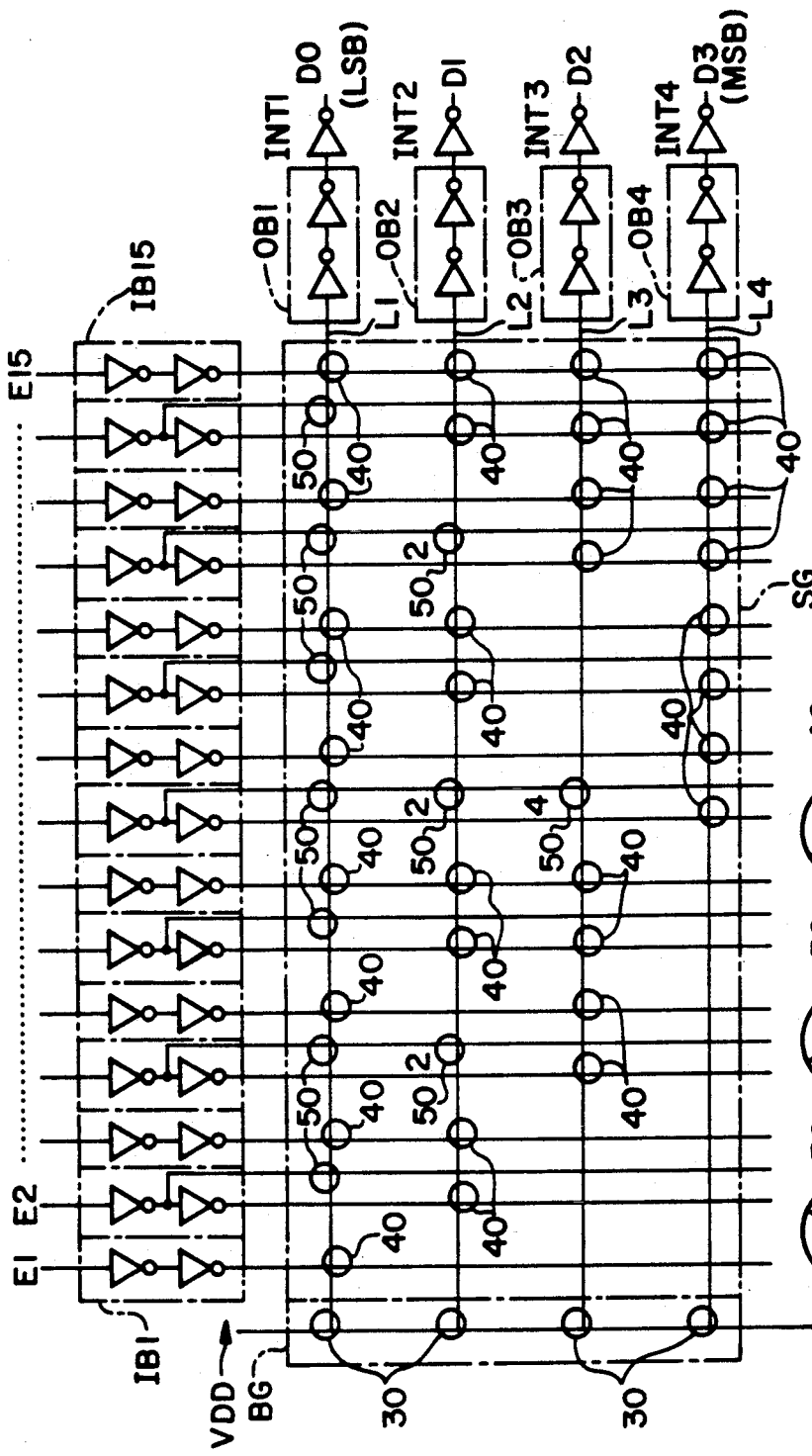
FIG. 2A is a circuit diagram of the priority encoder according to the present invention.
FIGS. 2B -2D show the types of transistors utilized in the circuit shown in FIG. 2A.

The priority encoder according to the present invention is shown in FIG. 2.

In FIG. 2, the priority encoder includes a section for receiving the input, a section for sending the output and a section for connecting the input side to the output side.

The input section, that is, the input side neuron group comprises buffer amplifiers IB1 to IB15 whose numbers correspond to the outputs of the comparators. A full-parallel compare is performed by inputting the analog signal commonly to each comparator. Each of the buffer amplifiers consists of two CMOS inverters connected in series.

The output section, that is, the output side neuron group comprises buffer amplifiers OB1 to OB4 whose numbers correspond to each output bit which is digitally converted. Each of the buffer amplifiers consists of two CMOS inverters which are connected in series.

The output side neuron group also comprises CMOS inverters INT1 to INT4 for inverting the output of each of the buffer amplifiers OB1, OB2, OB3 and OB4 and supplying each output terminal D0, D1, D2 and D3.

The conductance value of each of the MOS transistors is adjusted during the manufacturing process based on the geometrical aspect ratio, i.e., the ratio of channel width/channel length.

In a preferred embodiment of the present invention, the W/L values of the CMOS inverters are set to 12 $\mu$m/2 $\mu$m in the PMOS transistor, and 5 $\mu$m/2 $\mu$m in the NMOS transistor.

The section connecting the input side to the output side comprises a bias group BG, and a synapse group SG for connecting the input side neuron group to the output side neuron group.

The bias group BG is comprised of PMOS transistors 30 which couple the first power supply voltage ($V_{DD}$) to each of the input lines L1 to L4 of the output side buffer amplifiers OB1 to OB4.

Each element of the bias group BG comprises a PMOS transistor 30 having a drain electrode supplied with the first power supply voltage ($V_{DD}$), a gate electrode supplied with the second power supply voltage (ground potential), and a source electrode connected to each of the input lines L1 to L4 of the output side buffer amplifiers.

The W/L value of the PMOS transistor 30 is designed to be 5 μm/2 μm which corresponds to the weight of "1".

NMOS transistors 40 are provided in the synapse group (SG) at certain intersections of the output lines of the input buffer amplifiers and the input lines of the output buffer amplifiers, such that the binary value of the input bit corresponds to the output value. As an example, E6 (binary value of 6) has connections with L1 and L2 (corresponding binary value of 6 at D3 D2 D1 D0), and E14 has connections at L2, L3, L4 corresponding to the binary value of 14 at D3 D2 D1 D0. Each of the output lines of the input buffers is connected via NMOS transistors 40 to the input lines of the output buffers in a similar fashion. Each NMOS transistor 40 has a gate electrode connected to the output line of the input side buffer amplifier, a drain electrode connected to the input line of the output side buffer amplifier, and a source electrode supplied with the second power supply voltage (ground potential). The W/L value of the NMOS transistor 40 is 2 μm/2 μm providing the weight value of "1".

In order to offset the weight values of the NMOS transistors 40 the intersections of the output lines of the first inverters of every even input side buffer amplifier and the input lines of the output side buffer amplifiers are provided with the PMOS transistors 50. Line L1 has a PMOS transistor 50 connected for every even input buffer amplifier. L2 has a PMOS transistor 50 connected every fourth input buffer amplifier and L3 has a PMOS transistor 50 connected every eighth input buffer amplifier.

In each of these PMOS transistors, 50 a gate electrode is connected to the output line of the first inverter of the even input side buffer amplifier, a source electrode is connected to the input line of the output side buffer amplifier, and the first power supply voltage ($V_{DD}$) is applied to a drain electrode.

The W/L values of these PMOS transistors 50 are designed to have the 5 μm/2 μm of the weight "1" in the D0 (LSB) stage, 10 μm/2 μm of the weight "2" in the D1 stage, and 20 μm/2 μm of the weight "4" in the D2 stage, respectively, based on the weight value of the NMOS transistors 40 connected to each input line of the output side buffer amplifiers.

The operation of the priority encoder according to the present invention will be described in detail below. Since the mobility of the electron is 580 $cm^2$/V-sec, and that of the hole is 200 $cm^2$/V-sec, the ratio of the mobility of the electron to the hole becomes about 2.9:1. Therefore, if the respective conductance ratios of a PMOS transistor and a NMOS transistor are set to be "1" when the W/L value of the PMOS transistor 50 is 5 μm /2 μm and the W/L value of the NMOS transistor 40 is 2 μm/2 μm, and if the weight values of the PMOS transistor 50 and the NMOS transistor 40 are identical to each other, the output results in a value less than 2.5 volts when the first power supply voltage ($V_{DD}$) is 5 volts.

Figure 1:
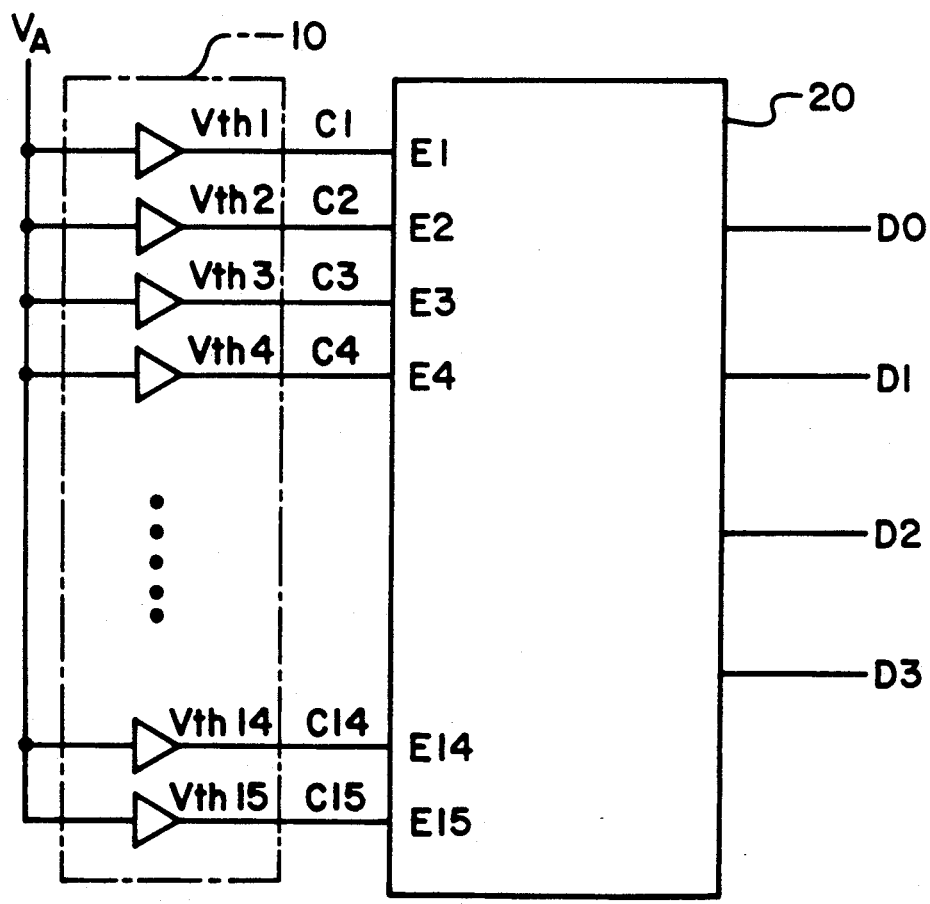
FIG. 1 is a block diagram of a 4-bit full-parallel ADC utilizing a comparator circuit.

In FIG. 1, if an analog input voltage VA is simultaneously supplied to each comparator having different threshold voltages $Vth1 \sim Vth15$, the comparator circuit compares the input voltage VA with each threshold voltage Vthi of the comparators, and then only the comparators having a threshold voltage less than the analog input voltage VA generate the logic state "high (1)".

For example, when the analog voltage of $Vth1 < VA < Vth3$ is input, only the first and second comparators generate the output of the logic state "1", that is, C1 and C2 is equal to 1, the output of the remaining comparators becomes logic state "0".

The output of these comparators are input to the priority encoder shown in FIG. 2, so that E1 and E2 become "1" and E3 to E15 become "0".

Therefore, the PMOS transistor 50 and NMOS transistor 40 connected to the E1 and E2 lines are turned on, and since the weight value of the LSB (D0) stage is 2 in the PMOS 50 and is 1 in the NMOS, 40 the voltage before the neuron OB1 of the LSB stage have a larger value than 2.5 volts, so that it becomes logic state "1" after passing the neuron OB1.

The above value finally becomes logic state "0" after passing inverter INT 1.

In addition, the weight value of the D1 stage is 1 in the PMOS, 50 and is 1 in the NMOS, 40 and thus the weight values are identical to each other, so that the input voltage of the neuron OB2 of D1 stage have the value less than 2.5 volts, then it becomes logic state "0" after passing the neuron OB2.

The above value finally becomes logic state "1" after passing the inverter INT 2.

Also, D2 stage and MSB (D3) stage finally output the logic state "0" respectively by the PMOS of the bias group, therefore, in this case, the digital output of the priority encoder becomes D3 D2 D1 D0=0010.

Accordingly, the input/output relation of the priority encoder circuit can be summarized as shown in the following Table 1.

TABLE 1

| Input/output relation of the priority encoder | | | | | | | | | | | | | | | | | | | |
|---|---|---|---|---|---|---|---|---|---|---|---|---|---|---|---|---|---|---|---|
| INPUT | | | | | | | | | | | | | | | | OUTPUT | | | |
| E1 | E2 | E3 | E4 | E5 | E6 | E7 | E8 | E9 | E10 | E11 | E12 | E13 | E14 | E15 | D3 | D2 | D1 | D0 |
| 0 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 | 0 | 0 | 1 |
| 1 | 1 | 0 | 0 | 0 | 0 | 0 | 0 | 0 | 0 | 0 | 0 | 0 | 0 | 0 | 0 | 0 | 1 | 0 |
| 1 | 1 | 1 | 0 | 0 | 0 | 0 | 0 | 0 | 0 | 0 | 0 | 0 | 0 | 0 | 0 | 0 | 1 | 1 |
| 1 | 1 | 1 | 1 | 0 | 0 | 0 | 0 | 0 | 0 | 0 | 0 | 0 | 0 | 0 | 0 | 1 | 0 | 0 |
| 1 | 1 | 1 | 1 | 1 | 0 | 0 | 0 | 0 | 0 | 0 | 0 | 0 | 0 | 0 | 0 | 1 | 0 | 1 |
| 1 | 1 | 1 | 1 | 1 | 1 | 0 | 0 | 0 | 0 | 0 | 0 | 0 | 0 | 0 | 0 | 1 | 1 | 0 |
| 1 | 1 | 1 | 1 | 1 | 1 | 1 | 0 | 0 | 0 | 0 | 0 | 0 | 0 | 0 | 0 | 1 | 1 | 1 |
| 1 | 1 | 1 | 1 | 1 | 1 | 1 | 1 | 0 | 0 | 0 | 0 | 0 | 0 | 0 | 1 | 0 | 0 | 0 |
| 1 | 1 | 1 | 1 | 1 | 1 | 1 | 1 | 1 | 0 | 0 | 0 | 0 | 0 | 0 | 1 | 0 | 0 | 1 |
| 1 | 1 | 1 | 1 | 1 | 1 | 1 | 1 | 1 | 1 | 0 | 0 | 0 | 0 | 0 | 1 | 0 | 1 | 0 |
| 1 | 1 | 1 | 1 | 1 | 1 | 1 | 1 | 1 | 1 | 1 | 0 | 0 | 0 | 0 | 1 | 0 | 1 | 1 |
| 1 | 1 | 1 | 1 | 1 | 1 | 1 | 1 | 1 | 1 | 1 | 1 | 0 | 0 | 0 | 1 | 1 | 0 | 0 |
| 1 | 1 | 1 | 1 | 1 | 1 | 1 | 1 | 1 | 1 | 1 | 1 | 1 | 0 | 0 | 1 | 1 | 0 | 1 |
| 1 | 1 | 1 | 1 | 1 | 1 | 1 | 1 | 1 | 1 | 1 | 1 | 1 | 1 | 0 | 1 | 1 | 1 | 0 |

TABLE 1-continued

| Input/output relation of the priority encoder | | | | | | | | | | | | | | | | | | |
|---|---|---|---|---|---|---|---|---|---|---|---|---|---|---|---|---|---|---|
| INPUT | | | | | | | | | | | | | | | OUTPUT | | | |
| E1 | E2 | E3 | E4 | E5 | E6 | E7 | E8 | E9 | E10 | E11 | E12 | E13 | E14 | E15 | D3 | D2 | D1 | D0 |
| 1 | 1 | 1 | 1 | 1 | 1 | 1 | 1 | 1 | 1 | 1 | 1 | 1 | 1 | 1 | 1 | 1 | 1 | 1 |

As described above, according to the present invention, the priority encoder is realized by the MOS array using neural network concepts, so that its construction is simplified and its operating speed is increased.

While a preferred embodiment of the present invention has been described and illustrated only for a 15 bit comparator input and 4 bit output, the invention should not be limited thereto but may be otherwise embodied within the scope of the following claims.

What is claimed is:

1. A priority encoder for outputting an M bit digital signal in response to a $2^M-1$ bit digital input, said priority encoder comprising:

input means for receiving the $2^M-1$ bit digital signal and generating a first plurality of non-inverted signals and a second plurality of inverted signals in response thereto;

encoder array means comprising $((\frac{1}{2} \cdot 2^M)-1)+(2^M-1)$ column lines and M row lines, each of said $((\frac{1}{2} \cdot 2'')-1)+(2^M-1)$ column lines for receiving a corresponding one of said first plurality of non-inverted signals and second plurality of inverted signals from said input means, said first plurality of non-inverted signals being coupled onto select ones of said M row lines by activating a plurality of weight based coupling transistors of a first type, said second plurality of inverted signals being coupled onto select ones of said M row lines by activating a plurality of weight based coupling transistors of a second type different from said first type;

bias means for coupling a bias voltage onto each of said M row lines coupled to activated ones of said pluralities of weight based coupling transistors of said first and second types, and maintaining a weighted/biased voltage signal along each of said M row lines in response to the $2^M-1$ digital signal input at the input means; and output means for receiving the corresponding weighted/biased voltage signal along each of said M row lines to generate the M bit digital signal output.

2. The priority encoder as claimed in claim 1, wherein each of said input and output means comprises a plurality of series connected CMOS inverters.

3. The priority encoder as claimed in claim 2, wherein said bias means comprises a plurality of bias transistors, each corresponding to each of said M row lines, each bias transistor having a drain electrode coupled to a first voltage, a gate electrode coupled to a second voltage, and a source electrode coupled to the respective one of said M row lines.

4. The priority encoder as in claim 1, wherein said weight based coupling transistors of said first and second types are NMOS transistors and PMOS transistors, respectively.

5. The priority encoder as in claim 4, wherein each NMOS and PMOS transistor current drive strength is a function of a predetermined weighted conductance strength respectively assigned thereto.

6. The priority encoder as in claim 4, wherein the predetermined weighted conductance strength is determined by the geometrical aspect ratio of each NMOS and PMOS transistor.

7. The priority encoder as in claim 6, wherein the transistor current drive strength of said NMOS transistors is fixed to a substantially constant value and the transistor current drive strength of said PMOS transistors is set to offset the current drive strength of said NMOS transistors along each of said M row lines.

8. The priority encoder as in claim 7, wherein the geometrical aspect ratio of all weight based NMOS coupling transistors is set to 2 $\mu$m/2 $\mu$m, and the geometrical aspect ratio of weight based PMOS coupling transistors disposed along a first one of said M row lines is set to 5 $\mu$m/2 $\mu$m, along a second one of said M row lines is set to 10 $\mu$m/2 $\mu$m, and along a third one of said M row lines is set to 20 $\mu$m/2 $\mu$m.

* * * * *